(12) United States Patent
Toyohara et al.

(10) Patent No.: US 9,158,078 B2
(45) Date of Patent: Oct. 13, 2015

(54) LASER MODULE

(71) Applicant: Fujikura Ltd., Tokyo (JP)

(72) Inventors: Nozomu Toyohara, Sakura (JP); Akira Sakamoto, Sakura (JP); Yohei Kasai, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/104,507

(22) Filed: Dec. 12, 2013

(65) Prior Publication Data

US 2014/0105538 A1 Apr. 17, 2014

Related U.S. Application Data

(63) Continuation of application No. PCT/JP2012/059154, filed on Apr. 4, 2012.

(30) Foreign Application Priority Data

Jun. 16, 2011 (JP) ................................ 2011-134550

(51) Int. Cl.
*G02B 6/12* (2006.01)
*G02B 6/42* (2006.01)
(Continued)

(52) U.S. Cl.
CPC ............ *G02B 6/4272* (2013.01); *G02B 6/4257* (2013.01); *G02B 6/4267* (2013.01); *H01S 5/02272* (2013.01); *G02B 6/426* (2013.01); *G02B 6/4207* (2013.01); *G02B 6/4219* (2013.01); *G02B 6/4236* (2013.01);
(Continued)

(58) Field of Classification Search
CPC .. G02B 6/4207; G02B 6/4219; G02B 6/4236; G02B 6/4238; G02B 6/4246; G02B 6/4248; G02B 6/4272; G02B 6/426; G02B 6/4257; H01S 5/022721; H01S 5/02236
USPC .................................................. 385/14–15, 25
See application file for complete search history.

(56) References Cited

U.S. PATENT DOCUMENTS 5,068,865 A 11/1991 Ohshima et al.
6,758,610 B2 7/2004 Ziari et al.
(Continued)

FOREIGN PATENT DOCUMENTS

JP 04-141606 A 5/1992
JP 2000-068583 A 3/2000
(Continued)

OTHER PUBLICATIONS

International Search Report, dated Jun. 26, 2012, issued in corresponding application No. PCT/JP2012/059154.
(Continued)

*Primary Examiner* — Ryan Lepisto
*Assistant Examiner* — Guy Anderson
(74) *Attorney, Agent, or Firm* — Westerman, Hattori, Daniels & Adrian, LLP

(57) ABSTRACT

The semiconductor laser module (1) includes: a laser mount (31) having thereon a semiconductor laser chip (32); a fiber mount (40) having thereon an optical fiber (2); a submount (20) on which the laser mount (31) and the fiber mount (40) are placed; and a substrate (10) on which the submount 20 is placed, the substrate (10) having protrusions (11*a* to 11*d*) on a top surface thereof, the submount 20 being joined to the substrate (10) with a soft solder (61) spread between the submount (20) and the substrate (10).

8 Claims, 4 Drawing Sheets

(51) Int. Cl.
*H01S 5/022* (2006.01)
*H01S 5/024* (2006.01)

(52) U.S. Cl.
CPC ............. *G02B6/4238* (2013.01); *G02B 6/4246* (2013.01); *G02B 6/4248* (2013.01); *G02B 6/4265* (2013.01); *H01S 5/02208* (2013.01); *H01S 5/02236* (2013.01); *H01S 5/02284* (2013.01); *H01S 5/02476* (2013.01)

(56) References Cited

U.S. PATENT DOCUMENTS

| | | | |
|---|---|---|---|
| 8,230,589 B2 * | 7/2012 | Lu et al. | 29/840 |
| 2009/0104727 A1 | 4/2009 | Krejci et al. | |
| 2011/0026558 A1 | 2/2011 | Raju et al. | |
| 2011/0267930 A1 * | 11/2011 | Hurley et al. | 369/13.32 |
| 2012/0177074 A1 * | 7/2012 | Liu et al. | 372/36 |

FOREIGN PATENT DOCUMENTS

| | | |
|---|---|---|
| JP | 2002-162542 A | 6/2002 |
| JP | 2003-037324 A | 2/2003 |

OTHER PUBLICATIONS

Notification of Transmittal of Translation of the International Preliminary Report on Patentability (Forms PCT/IB/338) of International Application No. PCT/JP2012/059154 mailed Jan. 3, 2014 with Forms PCT/IB/373 and PCT/ISA/237.

Japanese Office Action dated Nov. 11, 2014, issued in corresponding Japanese Patent Application No. 2011-134550, w/English translation (7 pages).

Office Action dated Feb. 4, 2015, issued in corresponding Chinese Patent Application No. 201280029305.4, with English translation (16 pages).

Extended European Search Report dated Mar. 24, 2015, issued in corresponding EP Patent Application No. 12800321.7 (5 pages).

Decision of Refusal dated Jun. 2, 2015, issued in corresponding Japanese Patent Application No. 2011-134550 with English translation (6 pages).

* cited by examiner

LASER MODULE

CROSS-REFERENCE TO RELATED APPLICATIONS

This application is a Continuation of PCT International Application No. PCT/JP2012/059154 filed in Japan on Apr. 4, 2012, which claims the benefit of Patent Application No. 2011-134550 filed in Japan on Jun. 16, 2011, the entire contents of which are hereby incorporated by reference.

TECHNICAL FIELD

The present invention relates to a laser module that is to be attached at an end of an optical fiber.

BACKGROUND ART

Laser modules have been widely used as devices to emit a laser beam into an optical fiber. A laser module includes a laser source which emits a laser beam, an optical fiber which receives the laser beam, and a heat-dissipating board which have both the laser source and the optical fiber attached thereto. The laser source and the optical fiber are fixed on the heat-dissipating board and positioned so that a laser beam from the laser source efficiently enters the optical fiber.

Generally, in the laser module, the laser source and the optical fiber are not directly attached to the heat-dissipating board. Instead, a laser mount and a fiber mount are first attached to the heat-dissipating board, and then the laser source and the optical fiber are attached to the laser mount and the fiber mount, respectively. For example, Patent Literature 1 discloses an optical fiber having such a configuration.

However, according to such a laser module, heat generated in the laser source causes great stress on solder which joins the laser mount and the heat-dissipating board together. This may result in displacement of the laser source or may cause damage to the solder. Such problems occur mainly because of a difference between (i) thermal expansion coefficient of the laser mount which is made from AlN (aluminum nitride) or CuW (copper tungsten) and (ii) thermal expansion coefficient of the heat-dissipating board which is made from Cu (copper).

In order to avoid such problems, Patent Literature 2 discloses a technique of fixing the heat-dissipating board and the laser mount with soft solder. Patent Literature 2 teaches that the soft solder can absorb stress resulting from a difference between the thermal expansion coefficients of the heat-dissipating board and the laser mount.

CITATION LIST

Patent Literatures

Patent Literature 1
    Specification of U.S. Pat. No. 6,758,610 B (Registration Date: Jun. 6, 2004)
Patent Literature 2
    Specification of U.S. Patent Application No. 2009/0104727 A (Publication Date: Apr. 23, 2009)

SUMMARY OF INVENTION

Technical Problem

However, the inventors of the present invention have found that, in a case where soft solder is used to join the heat-dissipating board and the laser mount together in the laser module, the thickness of the soft solder is approximately 40 µm. The soft solder having a thickness of 40 µm is not sufficient to fully absorb the stress resulting from the difference between the thermal expansion coefficients of the heat-dissipating board and the laser mount. Therefore, there is still a possibility that the laser source is displaced or the solder is damaged. These problems are particularly noticeable in laser modules including a high-power semiconductor laser, which laser modules have been recently in high demand.

Furthermore, in a case where the soft solder is used to join the heat-dissipating board and the laser mount together, the position of the laser mount relative to the heat-dissipating board greatly varies. As a result, the position of the laser source relative to the optical fiber also greatly varies, and thus the laser module suffers a greater loss. Such problems also cannot be ignored.

The present invention has been made in view of the foregoing problems, and an object of the present invention is to realize a reliable laser module which does not cause the problems as described above.

Solution to Problem

In order to attain the object, a laser module of the present invention includes: a laser mount having thereon a laser source that emits a laser beam; a fiber mount having thereon an optical fiber that receives the laser beam; a submount on which the laser mount and the fiber mount are placed; and a substrate on which the submount is placed, the substrate having a spacer thereon, the spacer keeping a gap between the submount and the substrate, and the submount being joined to the substrate with solder spread between the submount and the substrate.

According to the configuration above, since the gap between the submount and the substrate is kept by the spacer, the solder for joining the submount to the substrate can have a thickness as great as the height of the spacer. This makes it possible, even in a case where the substrate and the submount are made from materials having respective different thermal expansion coefficients, to cause the solder to sufficiently absorb stress resulting from a difference between the thermal expansion coefficients of the substrate and the submount. Therefore, it is possible to realize a reliable laser module which does not cause problems such as displacement of the laser source and damage to the solder.

Furthermore, both the laser mount and the fiber mount are placed on the submount. Therefore, even if the position of the submount relative to the substrate greatly varies, this does not lead to variations in the position of the laser source relative to the optical fiber. Accordingly, loss is suppressed in the laser module.

Advantageous Effects of Invention

According to the present invention, it is possible to realize a highly reliable laser module which does not cause problems such as displacement of the laser source and damage to solder.

DESCRIPTION OF EMBODIMENTS

The following description will discuss a laser module of the present embodiment with reference to the drawings. Hereinafter, the laser module of the present embodiment, which includes a semiconductor laser (also called a "laser diode") as a laser source, is referred to as a "semiconductor laser module". Note, however, that a laser source which is applicable to the laser module of the present invention is not limited to a semiconductor laser source.

In the following descriptions, when a plate-like member composed of six surfaces is discussed, two largest surfaces of the six surfaces are each referred to as a "main surface", and the other four surfaces are each referred to as a "side surface". In a case where it is necessary to distinguish between the two main surfaces, one of the two main surfaces is referred to as a "top surface" and the other is referred to as a "bottom surface". Note here that the top surface means a main surface that faces up when a device including the plate-like member is positioned for normal use, whereas the bottom surface means a main surface that faces down when the device including the plate-like member is positioned for normal use.

[Configuration of Semiconductor Laser Module]

Figure 1:
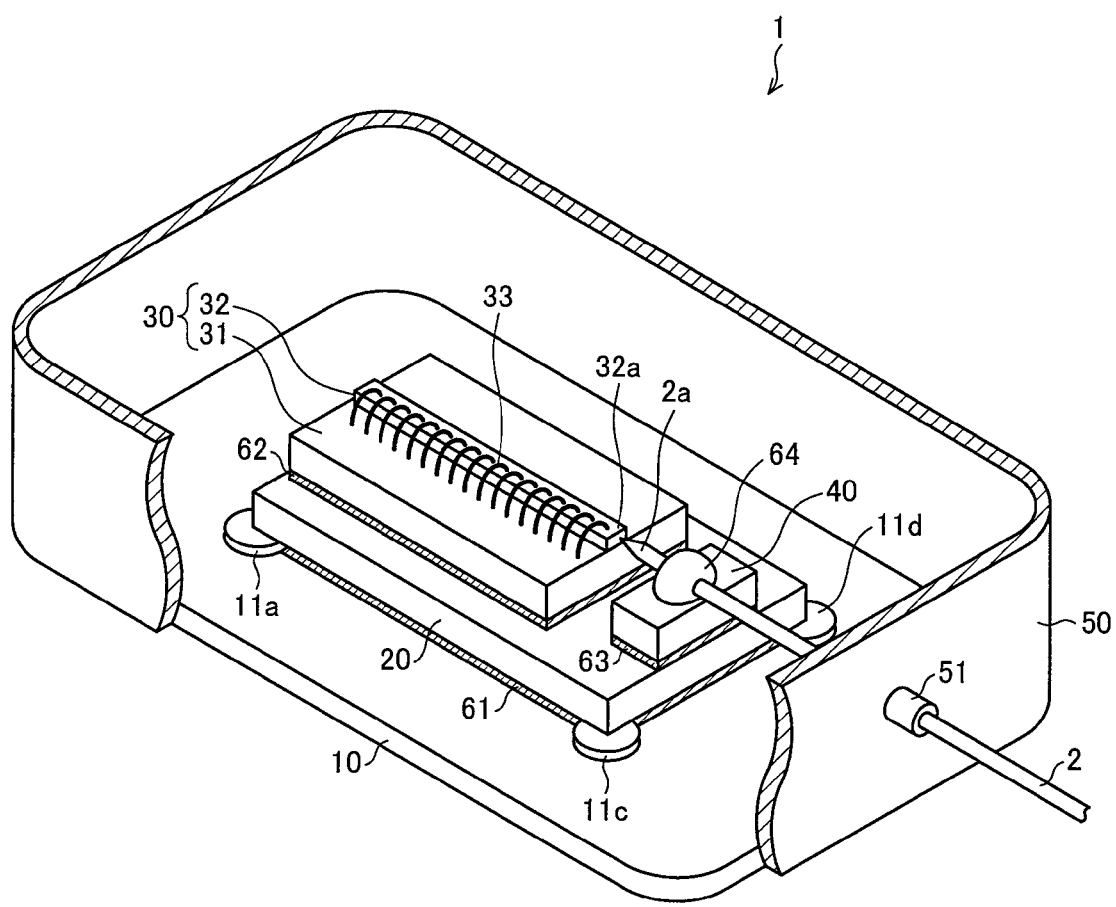
FIG. 1 is a general perspective view illustrating a semiconductor laser module of one embodiment of the present invention.
Figure 2:
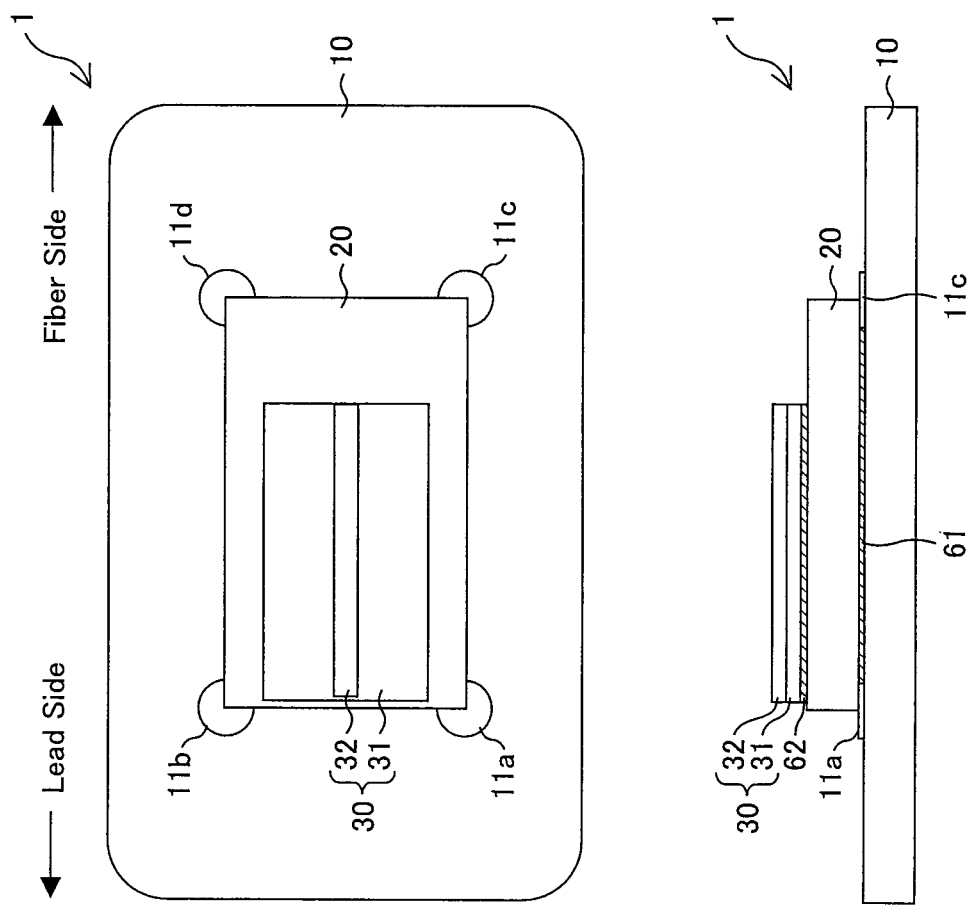
FIG. 2 is a three-view drawing of a configuration of a main part of the semiconductor module shown in FIG. 1.
Figure 2:
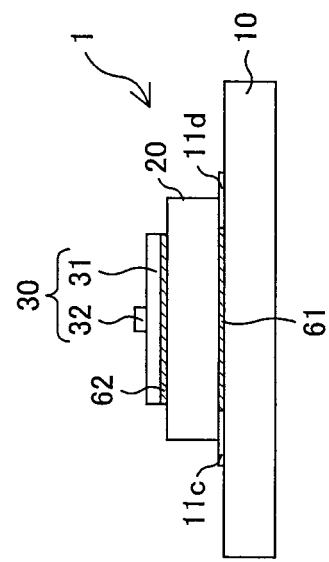

The following description discusses a semiconductor laser module 1 of the present embodiment with reference to FIGS. 1 and 2. FIG. 1 is a general perspective view illustrating the semiconductor laser module 1. FIG. 2 is a three-view drawing of a configuration of a main part (substrate 10, submount 20, and CoS 30) of the semiconductor module 1. In FIG. 2, a plan view (illustrating the semiconductor module 1 viewed from above) is in the upper left area, a side view is in the lower left area, and a front view is in the lower right area.

The semiconductor laser module 1 is a laser module which is to be attached at an end of an optical fiber 2. As shown in FIGS. 1 and 2, the semiconductor laser module 1 includes the substrate 10, the submount 20, the CoS (Chip on Submount) 30, a fiber mount 40, and a case 50. Note that, in FIG. 1, the top plate of the case 50 and a portion of the side walls of the case 50 are omitted so that an inner structure of the semiconductor laser module 1 is visible. Furthermore, in FIG. 2, constituents other than the substrate 10, the submount 20 and the CoS 30 are omitted for better understanding of the configuration of the main part of the semiconductor laser module 1.

The substrate 10 serves as the bottom plate of the semiconductor laser module 1. In the present embodiment, the substrate 10 is a plate-like member whose main surfaces have a rectangular shape with rounded corners (see FIGS. 1 and 2). The substrate 10 serves as a heat sink for dissipating heat from the inside of the semiconductor laser module 1 (particularly from the CoS 30) to the outside of the semiconductor laser module 1. To this end, the substrate 10 is made from a highly heat-conductive material such as Cu (copper).

As illustrated in FIGS. 1 and 2, the top surface of the substrate 10 has four protrusions 11a to 11d thereon. Each of the four protrusions 11a to 11d serves as a spacer to keep a gap between the bottom surface of the submount 20 and the top surface of the substrate 10. The four protrusions 11a to 11d, which are integral with the substrate 10, are formed by punching, cutting, or the like.

As illustrated in FIGS. 1 and 2, the substrate 10 has the submount 20 on its top surface.

The submount 20 is a support for supporting the CoS 30 and the fiber mount 40. In the present embodiment, as shown in FIGS. 1 and 2, the submount 20 is a plate-like member whose main surfaces have a rectangular shape. The submount 20 is placed so that (i) the bottom surface of the submount 20 is parallel to the top surface of the substrate 10 and (ii) long sides of the main surfaces of the submount 20 are parallel to long sides of the main surfaces of the substrate 10. The submount 20 is joined to the top surface of the substrate 10 with soft solder 61 spread between the bottom surface of the submount 20 and the top surface of the substrate 10. Note that a specific example of the substrate 10 is described later with reference to other drawings.

As illustrated in FIGS. 1 and 2, the submount 20 has the CoS 30 and the fiber mount 40 on its top surface. On the top surface of the submount 20, the fiber mount 40 is on a side where the optical fiber 2 is drawn out (such a side is at the lower right of FIG. 1 and is hereinafter referred to as a "fiber side"), whereas the CoS 30 is on an opposite side opposite to the side where the optical fiber 2 is drawn out (such an opposite side is at the upper left of FIG. 1 and is hereinafter referred to as a "lead side"). Note that a specific example of the submount 20 is described later with reference to other drawings.

The CoS 30 is constituted by a laser mount 31 and a semiconductor laser chip 32 which are integral with each other.

The laser mount 31 is a support for supporting the semiconductor laser chip 32. In the present embodiment, the laser mount 31 is a plate-like member whose main surfaces have a rectangular shape, and this laser mount 31 is placed so that (i) the bottom surface of the laser mount 31 is parallel to the top surface of the submount 20 and (ii) long sides of the main surfaces of the laser mount 31 are parallel to the long sides of the main surfaces of the submount 20 (see FIGS. 1 and 2). The laser mount 31 is joined to the top surface of the submount 20 with hard solder 62 spread between the bottom surface of the laser mount 31 and the top surface of the submount 20.

As illustrated in FIGS. 1 and 2, the laser mount 31 has the semiconductor laser chip 32 on its top surface. The semiconductor laser chip 32 is a laser source configured to emit a laser beam from its end surface 32a. In the present embodiment, the semiconductor laser chip 32 is a high-power semiconductor laser which is made mainly of GaAs (gallium arsenide) and has a cavity length of equal to or greater than 5 mm. The semiconductor laser chip 32 is placed so as to extend along a direction parallel to the long sides of the main surfaces of the laser mount 31, and the bottom surface of the semiconductor laser chip 32 is joined to the top surface of the laser mount 31 (see FIGS. 1 and 2). Furthermore, the semiconductor laser chip 32 is connected, via a wire 33, to a circuit which is provided on the top surface of the laser mount 31 (see FIG. 1). The semiconductor laser chip 32 is driven by electric current supplied from the circuit.

The fiber mount 40 is a support for supporting the optical fiber 2. In the present embodiment, the fiber mount 40 is a plate-like member whose main surfaces have a rectangular shape, and this fiber mount 40 is placed so that (i) the bottom surface of the fiber mount 40 is parallel to the submount 20 and (ii) the long sides of the main surfaces of the fiber mount 40 are perpendicular to the long sides of the main surfaces of the submount 20 (see FIGS. 1 and 2). The fiber mount 40 is joined to the top surface of the submount 20 with hard solder 63 spread between the bottom surface of the fiber mount 40 and the top surface of the submount 20.

As illustrated in FIG. 1, the fiber mount 40 has thereon the optical fiber 2 which is drawn into the semiconductor laser module 1 through an insertion pipe 51 provided to the case 50. The optical fiber 2 is attached to the top surface of the fiber mount 40 with solder 64 so that its tapered pointed end 2a directly faces the end surface 32a of the semiconductor laser chip 32. A laser beam emitted from the end surface 32a of the semiconductor laser chip 32 enters the optical fiber 2 through the pointed end 2a and travels in the optical fiber 2.

In the semiconductor laser module 1, the semiconductor laser chip 32 generates heat while it is being driven. The heat generated in the semiconductor laser chip 32 is conducted (i) to the laser mount 31, (ii) to the submount 20 via the hard solder 62, (iii) to the substrate 10 via the soft solder 61, and then (iv) is dissipated to the outside via the bottom surface of the substrate 10. Therefore, while the semiconductor laser chip 32 is being driven, there is a rise in temperatures of the laser mount 31, the submount 20, and the substrate 10 through each of which the heat generated in the semiconductor laser chip 32 passes.

Because of this, while the semiconductor laser chip 32 is being driven, the laser mount 31, the submount 20, and the substrate 10 thermally expand. Thus, in a case where the laser mount 31, the submount 20, and the substrate 10 have different thermal expansion coefficients, this causes stress applied between these members. The stress applied between the members may cause a change in relative positions of the CoS 30 and the optical fiber 2 and cause damage to the solder 61 and the solder 62. Particularly, in the case of a laser module including a high-power semiconductor laser like the semiconductor laser module 1 of the present embodiment, a large amount of heat is generated in the semiconductor laser. Therefore, the above problems directly lead to a serious degradation in reliability.

In view of the circumstances, according to the present embodiment, the laser mount 31 and the submount 20 are made from a material(s) having the same or substantially the same thermal expansion coefficients so that less stress is generated between the laser mount 31 and the submount 20. Specifically, both the laser mount 31 and the submount 20 are made from AlN (aluminum nitride) so that less stress is generated between the laser mount 31 and the submount 20. Since the thermal expansion coefficient of AlN is substantially the same as that of GaAs constituting the semiconductor laser chip 32, the laser mount 31 made from AlN also suppresses stress between the semiconductor laser chip 32 and the laser mount 31.

On the other hand, the substrate 10 needs to be made from a highly heat-conductive material (e.g., Cu) for heat dissipation. Therefore, it is not easy to find, for the substrate 10, a material which has the same or substantially the same thermal expansion coefficient as that of the submount 20. In view of this, according to the present embodiment, the substrate 10 and the submount 20 are joined together with the soft solder 61 so that stress resulting from a difference between the thermal expansion coefficients of the substrate 10 and the submount 20 is absorbed by the soft solder 61.

Note, however, that the arrangement in which the substrate 10 and the submount 20 are joined together simply with the soft solder 61 is not enough to sufficiently absorb the stress, because the soft solder 61 in this case has a thickness of approximately 40 μm. In view of this, according to the present embodiment, the following arrangement is employed: the four protrusions 11a to 11d on the top surface of the substrate 10 keep a gap between the bottom surface of the submount 20 and the top surface of the substrate 10 and the gap between the bottom surface of the submount 20 and the top surface of the substrate 10 is filled with the soft solder 61, whereby the soft solder 61 has a thickness greater than 40 μm. Specifically, the protrusions 11a to 11d have a height of approximately 120 μm to 180 μm, that is, the soft solder 61 has a thickness of approximately 120 μm to 180 μm, whereby the soft solder 61 can sufficiently absorb the stress. Thus, even if the substrate 10 and the submount 20 thermally expand to respective different extents, only the soft solder 61 undergoes elastic deformation. Therefore, the submount 20 is not deformed and thus the relative positions of the CoS 30 and the optical fiber 2 do not change, and the soft solder 61 is not damaged.

Note that, in this specification, "soft solder" means solder having a Young's modulus of not more than 50 Gpa. Examples of the soft solder include 90Sn-10Au (90tin-gold) solder, Sn—Ag—Cu (tin-silver-copper) solder, In—Sn (indium-tin) solder, Bi—In—Sn (bismuth-indium-tin) solder, and In 100% (indium 100%) solder. Note that the "soft solder" is defined as "solder having a Young's modulus of not more than 40 Gpa" in some literatures. However, the definition of the soft solder in this specification is, as mentioned above, the "solder having a Young's modulus of not more than 50 Gpa", which is different from the definition in those literatures.

As described above, the solder with which the substrate 10 and the submount 20 are joined together is preferably soft solder. However, it is needless to say that even solder having a Young's modulus of equal to or greater than 50 Gpa achieves a certain level of stress-absorbing effect, provided that the solder is softer than the submount 20 (that is, provided that the Young's modulus of the solder is smaller than that of the submount 20).

[Specific Example of Substrate]

Figure 3:
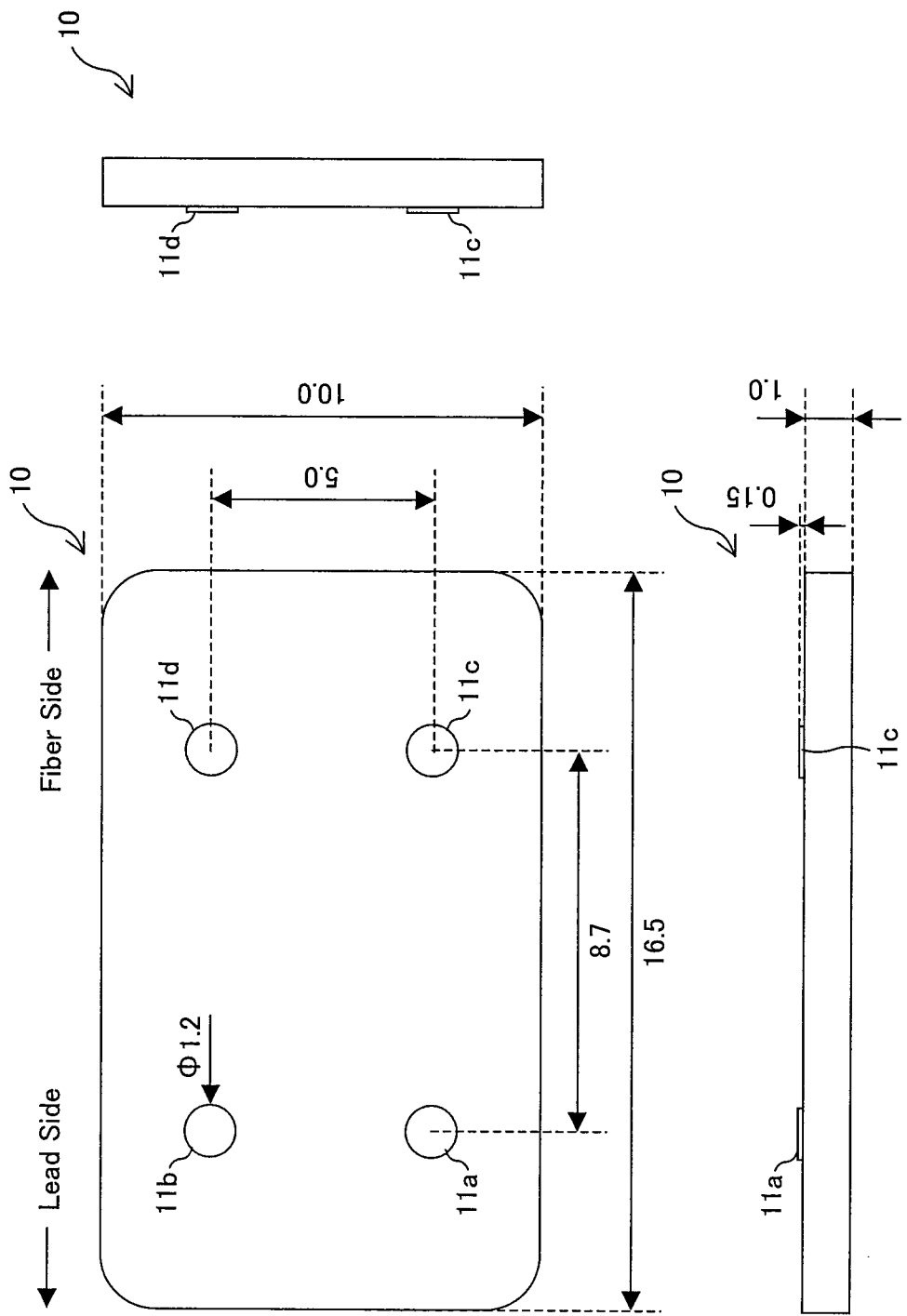
FIG. 3 is a three-view drawing of a specific example of a substrate included in the semiconductor laser module shown in FIG. 1.

The following description discusses a specific example of the substrate 10 of the semiconductor laser module 1 with reference to FIG. 3. FIG. 3 is a three-view drawing of the substrate 10. In FIG. 3, a plan view (illustrating the substrate 10 viewed from the top surface) is in the upper left area, a side view is in the lower left area, and a front view is in the upper right area.

As illustrated in FIG. 3, the substrate 10 is a plate-like member whose main surfaces have a rectangular shape with rounded corners and have a size of 16.5 mm (long side)×10.0 mm (short side), and it has a thickness of 1.0 mm. The substrate 10 is made of Cu (copper).

Each of the four protrusions 11a to 11d on the top surface of the substrate 10 is a columnar protrusion whose top surface is flat. More specifically, each of the four protrusions 11a to 11d is a columnar protrusion whose top surface is a circle having a diameter of 1.2 mm, and has a height of 0.15 mm. The four protrusions 11a to 11d are integral with the substrate 10, and are made from Cu (copper). The reason why the top surfaces of the protrusions 11a to 11d are flat is that, with this arrangement, the submount 20 and the protrusions 11a to 11d have surface contact with each other. This makes it possible, in the production of the semiconductor laser module 1, to stably carry out scrubbing of the submount 20 when joining the submount 20 to the substrate 10.

The protrusions 11a and 11b are arranged parallel to a lead-side short side of the top surface of the substrate so that the distance between the centers of the respective protrusions 11a and 11b is 0.5 mm. Similarly, the protrusions 11c and 11d are arranged parallel to a fiber-side short side of the top surface of the substrate 10 so that the distance between the centers of the respective protrusions 11c and 11d is 0.5 mm. The distance between the centers of the protrusion 11a and the protrusion 11c arranged parallel to one long side of the top surface of the substrate 10 is 8.7 mm. Similarly, the distance between the centers of the protrusion 11b and the protrusion 11d arranged parallel to the other long side of the top surface of the substrate 10 is 8.7 mm. In a case where the submount 20 is a plate-like member whose main surfaces have a rectangular shape of 9.5 mm (long side)×5.0 mm (short side), the four protrusions 11a to 11d are substantially at the four corners of the submount 20 (this is described later).

It is needless to say that the arrangement of the protrusions 11a to 11d is not limited to this. That is, the protrusions 11a to 11d may be located anywhere, provided that the submount 20 can be stably placed on the protrusions 11a to 11d. Furthermore, the number of the protrusions 11a to 11d is not limited to four, and may be three or five or more. However, in a case where the number of the protrusions 11a to 11d is reduced, the submount 20 easily slips off the protrusions 11a to 11d during the scrubbing. On the other hand, in a case where the number of the protrusions 11a to 11d is increased, there is a possibility that bonding strength between the submount and the substrate 10 decreases. That is, the arrangement in which the protrusions 11a to 11d are located at the four corners of the submount 20 is one of the best arrangements to satisfy both the stability during the scrubbing and the bonding strength.

The height of the protrusions 11a to 11d can be set to any value that is not less than 120 μm and not more than 180 μm. Note, here, that the reason why the height of the protrusions 11a to 11d should be not less than 120 μm is that, with this arrangement, the soft solder 62 has a sufficient stress-absorbing effect. On the other hand, the reason why the height of the protrusions 11a to 11d should be not more than 180 μm is that, with this arrangement, the thermal resistance r of the soft solder 62 is limited to 0.22° C./W or less and thus heat is sufficiently conducted from the submount 20 to the substrate 10.

For example, in a case where (i) the submount 20 is a submount shown in FIG. 3 (area S where the soft solder 62 spreads=8.7×5.0−0.6²×3.14≈42.4 mm²) and (ii) the soft solder 62 is 90Sn-10Au solder (thermal conductivity κ=20 W/m·K), the thermal resistance "r=(κ×S/d)$^{-1}$" of the soft solder 62 having a thickness d of 180 μm is r=0.212° C./W, which satisfies the above condition (thermal resistance r of 0.22° C./W or less). Note that the upper limit (0.22° C./W in the present embodiment) of the thermal resistance r of the soft solder 62 depends on (i) the configuration of the CoS 30 and (ii) electric power consumption and junction temperature of the semiconductor laser chip 31.

[Specific Example of Submount]

Figure 4:
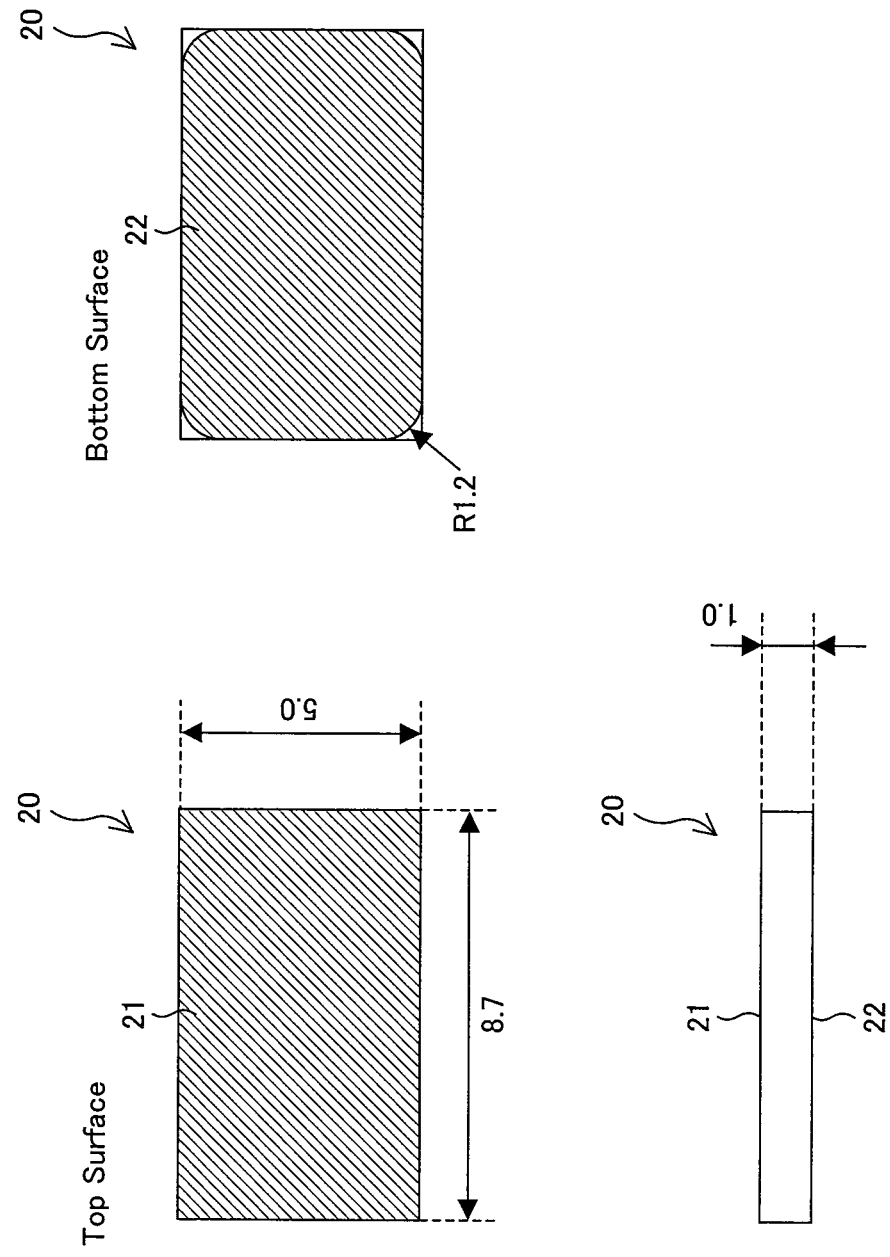
FIG. 4 is a three-view drawing of a specific example of a submount included in the semiconductor laser module shown in FIG. 1.

The following description discusses a specific example of the submount 20 of the semiconductor laser module 1 with reference to FIG. 4. FIG. 4 is a three-view drawing of the substrate 10. In FIG. 4, a plan view (illustrating the substrate 10 viewed from the top surface) is in the upper left area, a plan view (illustrating the substrate 10 viewed from the bottom surface) is in the upper right area, and a side view is in the lower left area.

As illustrated in FIG. 4, the submount 20 is a plate-like member whose main surfaces have a rectangular shape of 8.7 mm (long side)×5.0 (short side), and has a thickness of 1.0 mm. The submount 20 is made from AlN (aluminum nitride).

The top surface of the submount 20 is coated with metal 21. This is for joining the CoS 30 to the top surface of the submount 20 with the hard solder 62. Similarly, the bottom surface of the submount 20 is also coated with metal 22. This is for joining the substrate 10 to the bottom surface of the submount 20 with the soft solder 61.

It should be noted in FIG. 4 that the metal 21 covers the entire top surface of the submount 20, whereas the metal 22 covers a rectangular region with rounded corners, that is, a region other than the four corners of the bottom surface of the submount 20. The rounded corners of the metal 22 each have a radius of 1.2 mm.

This prevents the soft solder 61 from spreading out to the four corners of the bottom surface of the submount 20 which corners are not covered with the metal 22. That is, by placing the submount 20 on the substrate 10 so that the four corners of the bottom surface of the submount 20 which are not covered with the metal 22 abut against the top surfaces of the protrusions 11a to 11d, it is possible to prevent the soft solder 61 from seeping into a gap between the bottom surface of the submount 20 and the top surfaces of the protrusions 11a to 11d. That is, it is possible to prevent the connection between the submount 20 and the substrate 10 from being destroyed due to a thin layer of the soft solder 61 which is formed between the bottom surface of the submount 20 and the top surfaces of the protrusions 11a to 11d and is thinner than the other portions.

[How to Join Substrate and Submount]

Lastly, how to join the substrate 10 and the submount 20 together in the production of the semiconductor laser module 1 is briefly described below. The substrate 10 and the submount 20 can be joined together by, for example, the following steps S1 to S8.

Step S1: Place the substrate 10 on a heater stage.

Step S2: Place, on the substrate 10, the soft solder 61 (solid state) having a plate shape.

Step S3: Place the submount 20 on the soft solder 61 (solid state).

Step S4: Start heating the substrate 10 by the heater stage. After the substrate starts being heated by the heater stage, the temperature of the substrate 10 gradually rises.

Step S5: When the temperature of the substrate 10 reaches the melting point of the soft solder 61, the soft solder 61 starts melting from the substrate 10 side. After the soft solder 61 has completely melted, scrub the submount 20.

Step S7: Stop the heating of the substrate 10 by the heater stage. After the substrate 10 stops being heated by the heater stage, the temperature of the substrate 10 gradually decreases.

Step S8: Allow the soft solder 61 to cool. When the temperature of the soft solder 61 decreases to the melting point or under, the soft solder 61 solidifies and this completes the joining of the substrate 10 and the submount 20.

Note that the scrubbing of the submount 20 in step S5 means causing the submount 20 to slide for several times along a plane parallel to the top surface of the substrate 10. This (i) removes bubbles between the soft solder 61 and the bottom surface of the submount 20 and (ii) causes the soft solder 61 to uniformly spread over the entire metallized region (which is coated with the metal 22) of the bottom surface of the submount 20. As described earlier, the protrusions 11a to 11d of the substrate 10 on which the submount 20 is placed are equal in height and their top surfaces are flat. Therefore, it is possible to cause the submount 20 to slide without any trouble during the scrubbing.

[Closing]

As has been described, a laser module of the present embodiment includes: a laser mount having thereon a laser source that emits a laser beam; a fiber mount having thereon an optical fiber that receives the laser beam; a submount on which the laser mount and the fiber mount are placed; and a substrate on which the submount is placed, the substrate having a spacer thereon, the spacer keeping a gap between the submount and the substrate, and the submount being joined to the substrate with solder spread between the submount and the substrate.

According to the configuration above, since the gap between the submount and the substrate is kept by the spacer, the solder for joining the submount to the substrate can have a thickness as great as the height of the spacer. This makes it possible, even in a case where the substrate and the submount are made from materials having respective different thermal expansion coefficients, to cause the solder to sufficiently absorb stress resulting from a difference between the thermal expansion coefficients of the substrate and the submount. Therefore, it is possible to realize a reliable laser module which does not cause problems such as displacement of the laser source and damage to the solder.

Furthermore, both the laser mount and the fiber mount are placed on the submount. Therefore, even if the position of the submount relative to the substrate greatly varies, this does not lead to variations in the position of the laser source relative to the optical fiber. Accordingly, loss is suppressed in the laser module.

The laser module of the present embodiment is preferably configured such that the solder is soft solder having a Young's modulus of not more than 50 Gpa.

According to the configuration, in a case where the submount is made of a material having a Young's modulus of equal to or greater than 50 Gpa, the solder can absorb deformation of the substrate resulting from thermal expansion and prevent the deformation from affecting the submount. Furthermore, it is possible to freely select the material for the submount from materials having a Young's modulus of not less than 50 Gpa.

The laser module of the present embodiment is preferably configured such that the solder has a Young's modulus which is smaller than a Young's modulus of the submount.

According to the configuration, the solder is elastically deformable. Therefore, the solder can absorb deformation of the substrate resulting from thermal expansion and prevent the deformation from affecting the submount.

The laser module of the present embodiment is preferably configured such that the spacer is integral with the substrate.

According to the configuration, the spacer and the substrate are integral with each other. Therefore, heat is conducted from the submount to the substrate quickly as compared to a case where the spacer and the substrate are joined together with, for example, solder.

The laser module of the present embodiment is preferably configured such that the spacer has a columnar shape whose surface abutting against the submount is flat.

In the production of the laser module, in the step of joining the submount to the substrate with the solder, it is preferable to cause the submount to slide (be scrubbed) for several times to remove bubbles between the submount and the solder. According to the configuration, since the submount abuts against the flat surfaces of the spaces, it is possible to stably carry out the sliding.

The laser module of the present embodiment is preferably configured such that the spacer has a height of more than 40 μm.

According to the configuration, it is possible to cause the solder to have a larger thickness as compared to a case where the substrate and the submount are joined together with the solder without the spacer. Therefore, the solder can absorb a greater deformation of the substrate as compared to the case where the substrate and the submount are joined together with the solder without the spacer.

The laser module of the present embodiment is preferably configured such that a surface of the submount which surface faces the substrate is partially metallized; and the submount is placed on the substrate so that the spacer abuts against an unmetallized portion(s) of the surface of the submount.

According to the configuration, it is possible to prevent the solder from seeping into a gap between the spacer and the submount. Therefore, it is possible to prevent the connection between the submount and the substrate from being destroyed due to a thin layer of the solder which is formed between the spacer and the submount and is thinner than the other portions.

The laser module of the present embodiment is preferably configured such that the submount is made from a material having a thermal expansion coefficient which is the same or substantially the same as that of a material for the laser mount.

According to the configuration, little or no stress is applied to solder for joining the laser mount to the submount. Therefore, hard solder can be used to join the laser mount and the submount together. This makes it possible to reduce variations in the position of the laser mount relative to the submount, and further reduce loss that the laser module suffers.

[Additional Descriptions]

The present invention is not limited to the description of the embodiments described above, but may be altered within the scope of the claims. That is, an embodiment based on a proper combination of technical means disclosed in different embodiments is encompassed in the technical scope of the present invention.

INDUSTRIAL APPLICABILITY

The present invention is applicable to a laser module to be connected to an optical fiber. In particular, the present invention is suitable for use in a laser module (semiconductor laser module) including a semiconductor laser.

REFERENCE SIGNS LIST

1 Semiconductor laser module (Laser module)
10 Substrate
11a to 11d Protrusion (Spacer)
20 Submount
30 CoS
31 Laser mount
32 Semiconductor laser chip (Laser source)
40 Fiber mount
50 Case
61 Soft solder
62, 63 Hard solder
2 Optical fiber

The invention claimed is:

1. A laser module, comprising:
a laser mount having thereon a laser source that emits a laser beam;
a fiber mount having thereon an optical fiber that receives the laser beam;
a submount on which the laser mount and the fiber mount are placed; and
a substrate on which the submount is placed,
the substrate having a spacer thereon, the spacer keeping a gap between the submount and the substrate, and
the submount being joined to the substrate with solder spread between the submount and the substrate,
wherein:
a surface of the submount which faces the substrate is partially metallized; and the submount is placed on the substrate so that the spacer abuts against an unmetallized portion of the surface of the submount.

2. The laser module as set forth in claim 1, wherein the solder is soft solder having a Young's modulus of not more than 50 Gpa.

3. The laser module as set forth in claim 1, wherein the solder has a Young's modulus which is smaller than a Young's modulus of the submount.

4. The laser module as set forth in claim 1, wherein the spacer is integral with the substrate.

5. The laser module as set forth in claim 1, wherein the spacer has a columnar shape whose surface abutting against the submount is flat.

6. The laser module as set forth in claim 1, wherein the spacer has a height of more than 40 μm.

7. The laser module as set forth in claim 1, wherein the submount is made from a material having a thermal expansion coefficient which is the same or substantially the same as that of a material for the laser mount.

8. A method for producing a laser module, wherein the laser module comprises:

a laser mount having thereon a laser source that emits a laser beam;

a fiber mount having thereon an optical fiber that receives the laser beam;

a submount on which the laser mount and the fiber mount are placed; and a substrate on which the submount is placed, the substrate having four spacers which lie between the substrate and the submount and support four corners of the submount, the spacers keeping a gap between the submount and the substrate, and the submount being joined to the substrate with solder spread between the submount and the substrate, wherein the method comprising the step of:

joining the submount to the substrate with the solder, the step of joining including, after the solder has melted but before the solder solidifies, scrubbing the submount by causing the submount to slide along a plane parallel to a top surface of the substrate.

* * * * *